United States Patent [19]

Banerjee

[11] Patent Number: 5,895,977
[45] Date of Patent: Apr. 20, 1999

[54] BOND PAD FUNCTIONAL LAYOUT ON DIE TO IMPROVE PACKAGE MANUFACTURABILITY AND ASSEMBLY

[75] Inventor: Koushik Banerjee, Chandler, Ariz.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/694,929

[22] Filed: Aug. 8, 1996

[51] Int. Cl.$^6$ .......................... H01L 23/48; H01L 23/02
[52] U.S. Cl. .......................... 257/786; 257/784; 257/678
[58] Field of Search .......................... 257/784, 786, 257/703, 678

[56] References Cited

U.S. PATENT DOCUMENTS

| | | | |
|---|---|---|---|
| 5,091,772 | 2/1992 | Kohara et al. | 257/784 |
| 5,309,024 | 5/1994 | Hirano | 257/786 |

FOREIGN PATENT DOCUMENTS

| | | | |
|---|---|---|---|
| 61-193474 | 8/1986 | Japan | 257/786 |
| 1-191433 | 8/1989 | Japan | 257/786 |
| 3-283646 | 12/1991 | Japan | 257/784 |

Primary Examiner—Teresa M. Arroyo
Attorney, Agent, or Firm—Blakely, Sokoloff, Taylor & Zafman LLP

[57] ABSTRACT

An integrated circuit package which has a staggered bond wire pattern that increases the bond finger width to pad pitch ratio of the package. The package includes a first bond shelf, a second bond shelf and a third bond shelf. Mounted to the package is an integrated circuit which has a plurality of die pads. The die pads are arranged in a pattern of groups, wherein each group has a first die pad that is adjacent to a second die pad, and a third die pad that is adjacent to the second die pad and a first die pad of an adjacent group. Bond wires connect the first die pads to the first bond shelf, the second die pads to the second bond shelf and the third die pads to the third bond shelf, so that each adjacent die pad is connected to a different bond shelf. The staggered bond pattern maximizes the bond finger width of the package.

16 Claims, 1 Drawing Sheet

BOND PAD FUNCTIONAL LAYOUT ON DIE TO IMPROVE PACKAGE MANUFACTURABILITY AND ASSEMBLY

BACKGROUND OF THE INVENTION

1. Field of the Invention

The present invention relates to an integrated circuit package.

2. Description of Related Art

Integrated circuits are typically enclosed by a package that is mounted to an external printed circuit board. The integrated circuit has a plurality of outer die pads that are connected to corresponding bond fingers of the package. The pads are typically connected to the fingers by wires that are attached with an automated bonding machine.

The bond fingers have a width that is larger than the diameter of the wires to compensate for tolerances in the package, the integrated circuit and the bonding process of the wires. The width of each bond finger is significantly larger than the wire diameter to provide relatively large manufacturing yields for the package. A reduction in the bond finger width typically lowers the yield rate of the package.

The power and digital signals (I/O) of the integrated circuit are limited by the number of die pads that can be constructed on the device. Generally speaking the I/O and power can be increased by either enlarging the size of the integrated circuit or decreasing the spacing between die pads. The spacing is commonly referred to as the pad pitch. Increasing the size of the IC may reduce the yield of the device. Reducing the pitch requires a corresponding reduction in bond finger width which may also reduce the yield of the package. It would be desirable to provide a package that has a relatively low pad pitch but a high package yield rate.

SUMMARY OF THE INVENTION

The present invention is an integrated circuit package which has a staggered bond wire pattern that increases the bond finger width to pad pitch ratio of the package. The package includes a first bond shelf, a second bond shelf and a third bond shelf. Mounted to the package is an integrated circuit which has a plurality of die pads. The die pads are arranged in a pattern of groups, wherein each group has a first die pad that is adjacent to a second die pad, and a third die pad that is adjacent to the second die pad and a first die pad of an adjacent group. Bond wires connect the first die pads to the first bond shelf, the second die pads to the second bond shelf and the third die pads to the third bond shelf, so that each adjacent die pad is connected to a different bond shelf. The staggered bond pattern maximizes the bond finger width of the package.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
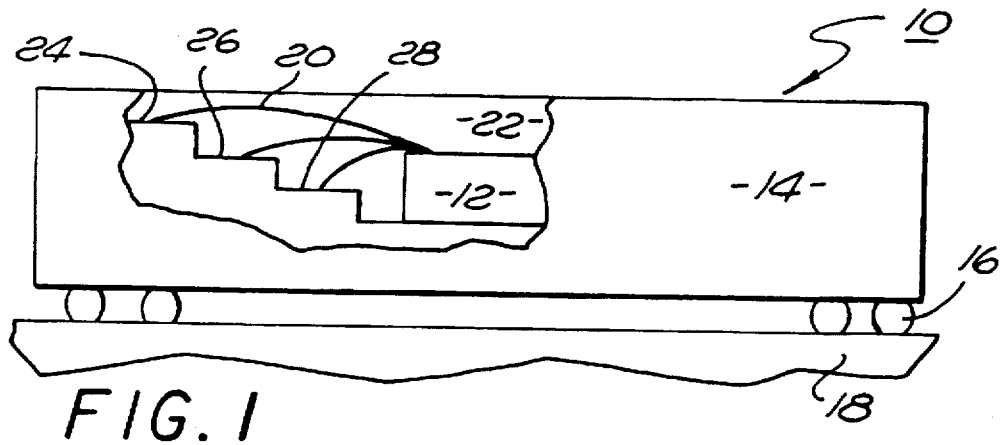
FIG. 1 is a side sectional view of an integrated circuit package.
Figure 2:
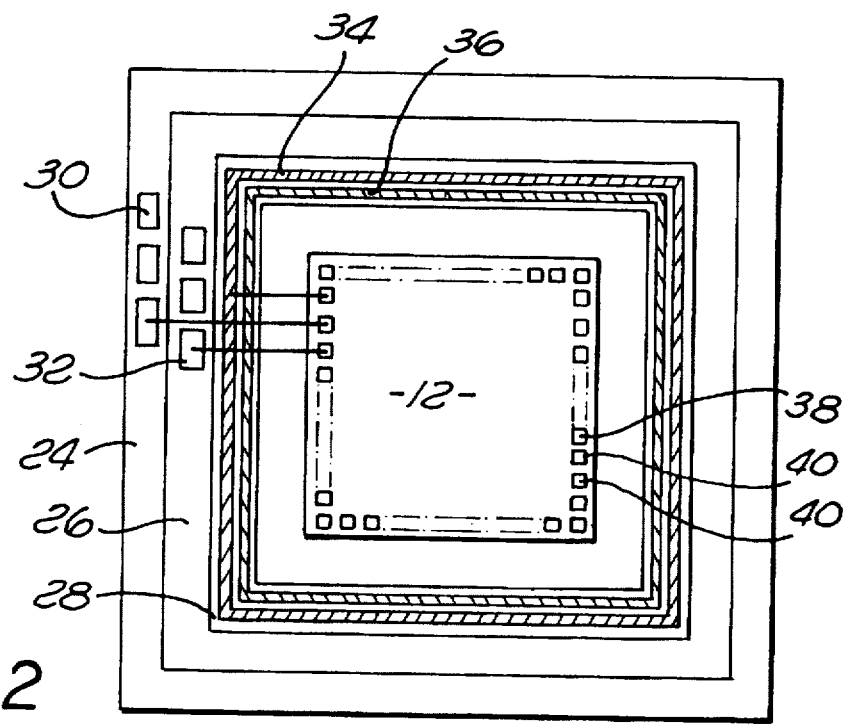
FIG. 2 is a top cross-sectional view of the integrated circuit package.
Figure 3:
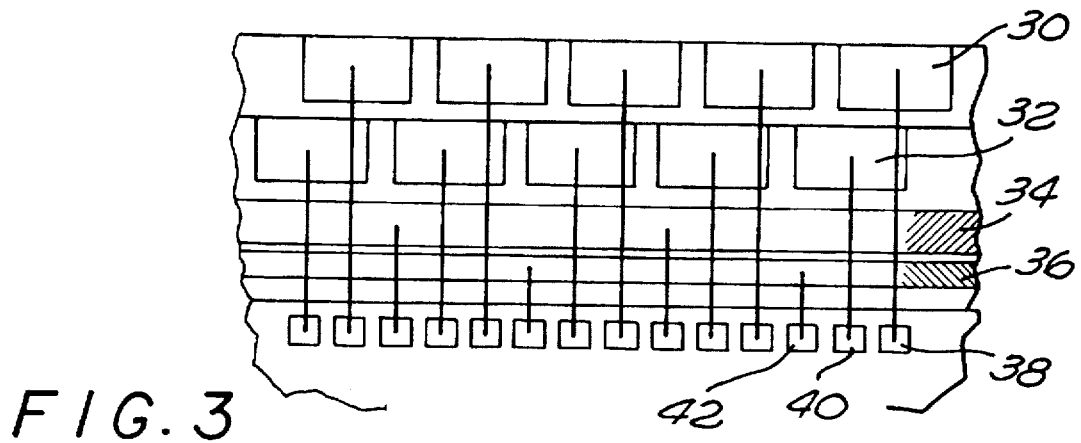
FIG. 3 is an enlarged sectional view showing a wire bond pattern of the present invention.

Referring to the drawings more particularly by reference numbers, FIGS. 1–3 show an integrated circuit package assembly 10. The assembly 10 includes an integrated circuit 12 that is enclosed by an integrated circuit package 14. The integrated circuit 12 may be a microprocessor or any other device. The integrated circuit package 14 has a plurality of external contacts 16 that connect the package 14 to an external printed circuit board 18. The contacts 16 may be solder balls, pins, or any other interconnect means known in the art.

The integrated circuit 12 is coupled to the package 14 by bond wires 20 located in a die cavity 22 of the assembly 10. The package 14 typically contains vias and other internal routing to couple the wire bonds to the external contacts 16 so that the integrated circuit 12 is electrically connected to the external circuit board 18. The package 14 may be constructed from known printed circuit board processes, wherein the die cavity 22 is filled with an encapsulant (not shown) to enclose the integrated circuit 12. Alternatively, the package may be constructed from other processes such as co-fired ceramic.

The package has a first bond shelf 24, a second bond shelf 26 and a third bond shelf 28 that each contain a plurality of surface pads that are connected to the integrated circuit 12 by the wire bonds 20. In the preferred embodiment the first bond shelf 24 has a plurality of first bond fingers 30 and the second bond shelf 26 has a plurality of second bond fingers 32. The third bond shelf 28 preferably has a power ring 34 and a ground ring 36. The power 34 and ground 36 fingers are typically connected to the power and ground busses (not shown) of the external circuit board 18 to provide power to the integrated circuit 12. The bond fingers 30 and 32 are typically connected to the digital signal lines of the circuit board 18 to provide the input/output (I/O) signals of the integrated circuit 12. Some of the bond fingers 30 and 32 may also be connected to peripheral power and ground busses of the package 14 and the circuit board 18.

The integrated circuit 12 has a plurality of die pads 38, 40 and 42 extending along the outer edge of the circuit die. The die pads 38, 40 and 42 are connected to the bond shelves by the bond wires 20. The die pads are arranged into a pattern of groups wherein each group contains a first die pad 38, a second die pad 40 and a third die pad 42. Each first die pad 38 is connected to a first bond finger 30 of the first bond shelf 24. Each second die pad 40 is connected to a second bond finger 32 of the second bond shelf 26. Each third die pad 42 is connected to either the power ring 34 or ground ring 36 of the third bond shelf 28.

The bond finger pattern is staggered so that each adjacent die pad is connected to an adjacent bond shelf of the package in a pattern that will be referred to as the 2:1 rule. The 2:1 rule is derived from an industry design guideline which states that it is preferred there should be two I/O pads for each power/ground pad, although it is to be understood that the present invention does not require a ratio of 2 I/O pads for each power/ground pad. The staggered interconnect pattern allows the space between adjacent bond fingers to be 3 times the pitch of the die pads. This is to be distinguished from the prior art wherein the bond finger pitch is 2 times the pitch of the die pads. The additional space between the bond fingers allows wider fingers to be formed on the package. The table below shows the increase in bond finger width for a given die pad pitch.

| Bond Pad Pitch | Bond-finger width without 2:1 | Bond-finger width with 2:1 |
| --- | --- | --- |
| 85 micron | (2*85) − 50 = 120 micron | (3*85) − 50 = 205 micron |
| 80 micron | (2*80) − 50 = 110 micron | (3*80) − 50 = 190 micron |
| 70 micron | (2*70) − 50 = 90 micron | (3*70) − 50 = 160 micron |

The wider fingers decrease the difficulty of assembling the package and increase the yield of the final product.

In the preferred embodiment, the first die pad 38 is a first input/output pin, the second die pad 40 is a second input/output pin and the third die pad 42 is either a power pin or a ground pin. The die pads of the integrated circuit 12 are preferably arranged into two groups of die pads. One group of die pads contains two I/O pins and a power pin. The second group of die pads contains two I/O pins and a ground pin. Although groups containing two I/O pins and a single power/ground pin are shown and described, it is to be understood that a group may have one I/O pin and two power/ground pins, particularly for a package that provides peripheral power such as a dual power supply. Alternatively, the integrated circuit 12 may contain blank die pads to preserve the staggered bond wire pattern of the present invention. Although three bond shelves are shown and described, it is to be understood that four or more shelves may be used. By way of example, in a four bond shelf package the die pads may be sequentially connected to the first shelf, second shelf, third shelf, fourth shelf, first shelf, second shelf and so forth and so on.

The package assembly 10 is assembled by initially mounting the integrated circuit 12 to the package 14. The bond wires are then attached to the die pads and bond fingers, typically with an automated wire bonding machine. Although wire bonds are shown and described, it is to be understood that the die pads could be attached to the bond shelves with a tape automated bonding (TAB) tape. After testing, the die cavity 22 is filled with encapsulant to enclose the integrated circuit 12. The package 14 can then be mounted to the external circuit board 18.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package, comprising:

a package that has a first bond shelf, a second bond shelf and a third bond shelf;

an integrated circuit which has a plurality of die pads arranged in a single row, said die pads being arranged in a pattern of groups which each include a first die pad that is adjacent to a second die pad, and a third die pad that is adjacent to said second die pad and a first die pad of an adjacent group; and, a plurality of interconnects that couple all of said first die pads to said first bond shelf, all of said second die pads to said second bond shelf, and all of said third die pads to said third bond shelf; and, a printed circuit board attached to said package.

2. The package as recited in claim 1, wherein said first and second bond shelves have a plurality of bond fingers that are connected to said interconnects.

3. The package as recited in claim 2, wherein said third bond shelf has a power ring that is connected to said interconnects.

4. The package as recited in claim 2, wherein said third bond shelf has a ground ring that is connected to said interconnects.

5. The package as recited in claim 3, wherein said third bond shelf has a ground ring that is connected to said interconnects.

6. The package as recited in claim 1, wherein said interconnects are bond wires.

7. The package as recited in claim 1, wherein said first die pad is an input/output pin and said third die pad is a power/ground pin.

8. The package as recited in claim 7, wherein said second die pad is an input/output pin.

9. An integrated circuit package, comprising:

a package that has a plurality of first bond fingers on a first bond shelf, a plurality of second bond fingers on a second bond shelf, and a power ring and a ground ring on a third bond shelf;

an integrated circuit which has a plurality of die pads arranged in a single row, said die pads being arranged in a pattern of groups including a first group and a second group, wherein said first group includes a first input/output die pad that is adjacent to a second input/output die pad, and a power die pad that is adjacent to said second input/output die pad, said second group includes a first input/output die pad that is adjacent to a second input/output die pad and a ground die pad that is adjacent to said second input/output pad; and, a plurality of interconnects that couple all of said first input/output die pads to said first bond fingers, all of said second input/output die pads to said second bond fingers, said power die pad to said power ring, and said ground die pad to said ground ring.

10. The package as recited in claim 1, wherein said interconnects are bond wires.

11. An integrated circuit package, comprising:

a package that has a first bond shelf, a second bond shelf and a third bond shelf;

an integrated circuit which has a plurality of die pads arranged in a single row, said die pads being arranged in a pattern of groups which each include a first die pad that is adjacent to a second die pad, and a third die pad that is adjacent to said second die pad and a first die pad of an adjacent group; and, a plurality of interconnects that couple all of said first die pads to said first bond shelf, all of said second die pads to said second bond shelf, and all of said third die pads to said third bond shelf; and, a printed circuit board attached to said package.

12. The package as recited in claim 11, wherein said first and second bond shelves have a plurality of bond fingers that are connected to said interconnects.

13. The package as recited in claim 12, wherein said third bond shelf has a power ring that is connected to said interconnects.

14. The package as recited in claim 12, wherein said third bond shelf has a ground ring that is connected to said interconnects.

15. The package as recited in claim 13, wherein said third bond shelf has a ground ring that is connected to said interconnects.

16. The package as recited in claim 11, wherein said interconnects are bond wires.

* * * * *

UNITED STATES PATENT AND TRADEMARK OFFICE
CERTIFICATE OF CORRECTION

PATENT NO. : 5,895,977

DATED : April 20, 2000

INVENTOR(S) : Banerjee

It is certified that error appears in the above-identified patent and that said Letters Patent is hereby corrected as shown below:

Column 3, line 60, delete ";and"
Column 3, line 61, delete "a printed circuit board attached to said Package."

Signed and Sealed this

Eighth Day of May, 2001

Attest:

NICHOLAS P. GODICI

*Attesting Officer*       Acting Director of the United States Patent and Trademark Office